United States Patent [19]
Morita et al.

[11] Patent Number: 6,091,747
[45] Date of Patent: Jul. 18, 2000

[54] CIRCUIT AND METHOD FOR DRIVING LASER DIODE

[75] Inventors: Takayoshi Morita; Akira Nagayama, both of Sapporo, Japan

[73] Assignee: Fujitsu Limited, Kawasaki, Japan

[21] Appl. No.: 08/936,612

[22] Filed: Sep. 24, 1997

[30] Foreign Application Priority Data

Mar. 19, 1997 [JP] Japan ................................. 9-065847

[51] Int. Cl.[7] .................................................. H01S 3/00
[52] U.S. Cl. .............................. 372/38; 372/26; 372/29; 372/33; 372/43
[58] Field of Search ........................ 372/9, 26, 29, 372/30, 33, 38, 43, 45, 46, 50

[56] References Cited

U.S. PATENT DOCUMENTS

| | | | |
|---|---|---|---|
| 4,612,671 | 9/1986 | Giles | 372/38 X |
| 4,806,873 | 2/1989 | Nagano | 372/38 X |
| 5,315,606 | 5/1994 | Tanaka | 372/38 |
| 5,736,844 | 4/1998 | Yanagisawa | 372/38 X |
| 5,761,230 | 6/1998 | Oono et al. | 372/38 |

*Primary Examiner*—Brian Healy
*Attorney, Agent, or Firm*—Staas & Halsey LLP

[57] ABSTRACT

A laser diode drive circuit comprising a laser diode; a drive pulse current source for emitting light or not emitting light of the laser diode according to an input signal; and a biasing unit for optimally operating the laser diode, the biasing unit having a bias voltage source for applying a bias voltage to the laser diode, which bias voltage can feed an optimum bias current to the laser diode. The laser diode drive circuit can maintain a bias current at a predetermined value with high precision and with high stability.

13 Claims, 10 Drawing Sheets

CIRCUIT AND METHOD FOR DRIVING LASER DIODE

BACKGROUND OF THE INVENTION

1. Field of the Invention

The present invention relates to a circuit and method for driving a laser diode.

One of apparatuses making up an optical transmission network is an optical transmission apparatus. This optical transmission apparatus is provided in an output stage thereof with an electro-optic signal converter which receives as its input an internally processed electric signal and converts this to an optical signal. As the light source of this electro-optic signal converter, usually a laser diode is used. The present invention will describe a circuit for driving this laser diode.

2. Description of the Related Art

As will be explained in detail later referring to the drawings, a threshold current (Ith) in a conventional laser diode is relatively large. Namely, the laser diode causes laser oscillation in a laser current region where the current exceeds a large threshold current value.

When handling increasingly high speed signal inputs in the future, however, if the threshold current is large, a light emission delay, explained later, would cause a serious problem. For this reason, attempts have been made to further reduce the threshold current and, in fact, laser diodes remarkably reduced in the threshold current have been commercialized. Such a laser diode exhibits a characteristic curve <1> which is plotted nearer the zero point than another characteristic curve <2> as will be explained later by referring to FIG. 11. In case of the curve <1>, the threshold current is Ith1 which is smaller than Ith2. With such a characteristic curve <1>, the bias current to be fed by a bias current source also becomes small, as shown by Ib1 smaller than Ib2 in the figure.

However, if the bias current becomes small as the above Ib1, when taking into account the unavoidable variations and fluctuations in the bias current sources themselves, it becomes very difficult to hold a very small predetermined bias current Ib1 with a high precision. In addition, the characteristics of a laser diode per se vary due to temperature fluctuations or aging, so there arises a problem that deterioration of the extinction ratio is almost inevitable.

SUMMARY OF THE INVENTION

Accordingly, in consideration of the above problem, an object of the present invention is to provide a circuit capable of driving a laser diode, even if the bias current becomes very small due to a reduction of the above threshold current, which circuit can maintain such very small bias current precisely and stably at a predetermined value for optimizing the operation of the laser diode.

To attain the above object, the present invention provides a laser diode drive circuit comprising a laser diode; a drive pulse current source for emitting light or not emitting light of the laser diode according to an input signal; and a biasing means for optimally operating the laser diode, where the biasing means having a bias voltage source for applying a bias voltage Vb to the laser diode, which voltage Vb can feed an optimum bias current Ib to the laser diode. This laser diode drive circuit can maintain a bias current at a predetermined value, even though it becomes very small due to a high speed driving of the diode, with high precision and at high stability, also with an extremely simple configuration.

BRIEF DESCRIPTION OF THE DRAWINGS

The above object and features of the present invention will be more apparent from the following description of the preferred embodiments given with reference to the accompanying drawings, wherein.

DESCRIPTION OF THE PREFERRED EMBODIMENTS

Before describing the embodiments of the present invention, the related art and the disadvantages therein will be described with reference to the related figures.

Figure 10:
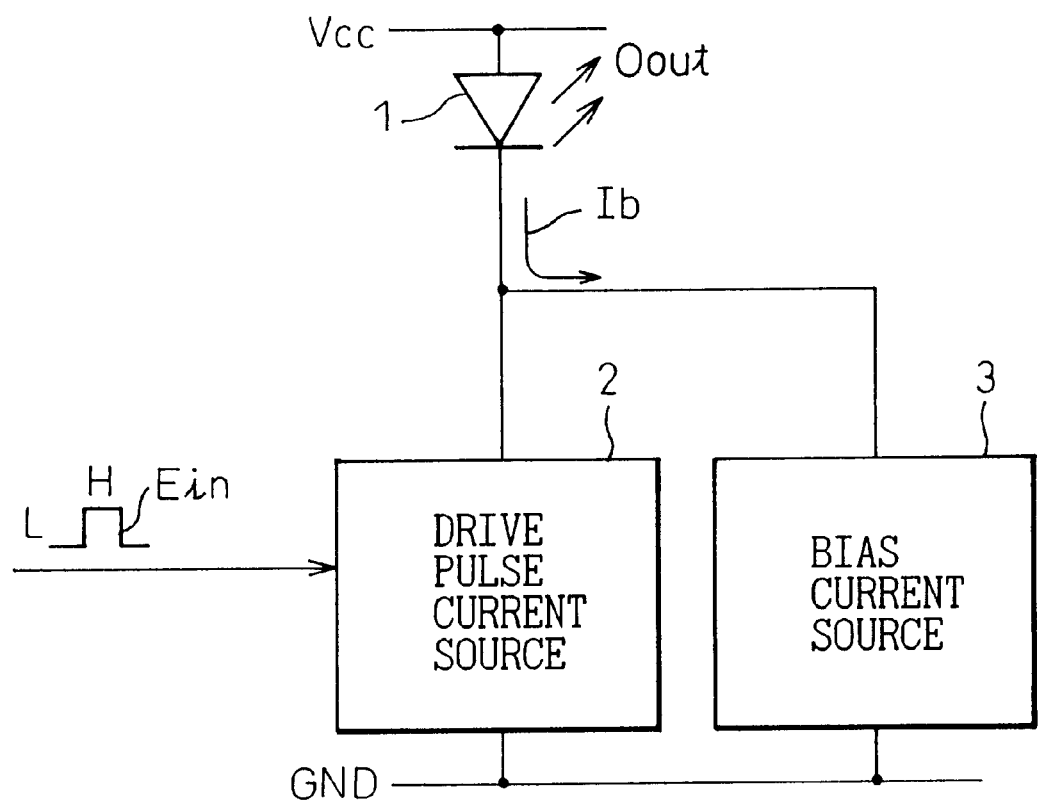
FIG. 10 is a view of a general laser diode drive circuit.

FIG. 10 is a view of a general laser diode drive circuit. Note, the figure covers a first example of the general laser diode drive circuit and a second example of the general laser diode drive circuit simultaneously.

The first example of the general laser diode drive circuit is provided with a laser diode 1 between a power source Vcc and a ground GND and provided with a drive pulse current source 2 for emitting light or not emitting light of the laser diode, when the signal input represented by an input electric signal Ein in the figure is given, in response to whether the level of the signal input is "H" (high) or "L" (low). The output light is denoted by Oout in the figure.

The laser diode drive circuit of the first example is based on the so-called "nonbias current drive method". When the level of the signal input (Ein) applied to the drive pulse current source 2 is the "L" level, the laser drive current is not given to the laser diode. When the level of the signal input is "H", the laser drive current is given to emit the light of the laser diode 1 (Oout). Namely, the laser drive current is controlled depending upon only the drive pulse current source 2.

The laser diode drive circuit of the first example is generally adopted for low speed drive use and not adopted for high speed drive use. The reason for this is that, when the laser diode is driven at a high speed, the discrepancy in timing between the signal input (Ein) and the optical output (Oout) can no longer be ignored, and a so-called light emission delay occurs. Such a light emission delay causes a deterioration of optical waves and, in the end, causes a degradation of the light transmission characteristic.

The laser diode drive circuit of the second example has been proposed as a circuit capable of suppressing the light emission delay causing the degradation of the light transmission characteristics even in high speed driving. The light emission delay is suppressed not only at low speed driving, but also at high speed driving. The laser diode drive circuit of the second example includes all constituent elements (1, 2, and 3) shown in the above FIG. 10 and corresponds to the laser diode drive circuit of the first example plus a bias current source 3. This bias current source 3 is for feeding the optimum bias current capable of optimally operating the laser diode 1.

When the laser diode 1 is driven without a bias current like the laser diode drive circuit of the first example, there is no problem at the time of low speed driving, but the above light emission delay occurs when it is driven at a high speed. Therefore, in the laser diode drive circuit of the second example, when the level of the signal input is "L", a very small current slightly lower than the threshold current with which the laser diode 1 starts oscillation is fed to the laser diode 1 as the bias current. It is the bias current source 3 that performs this feeding.

Figure 11:
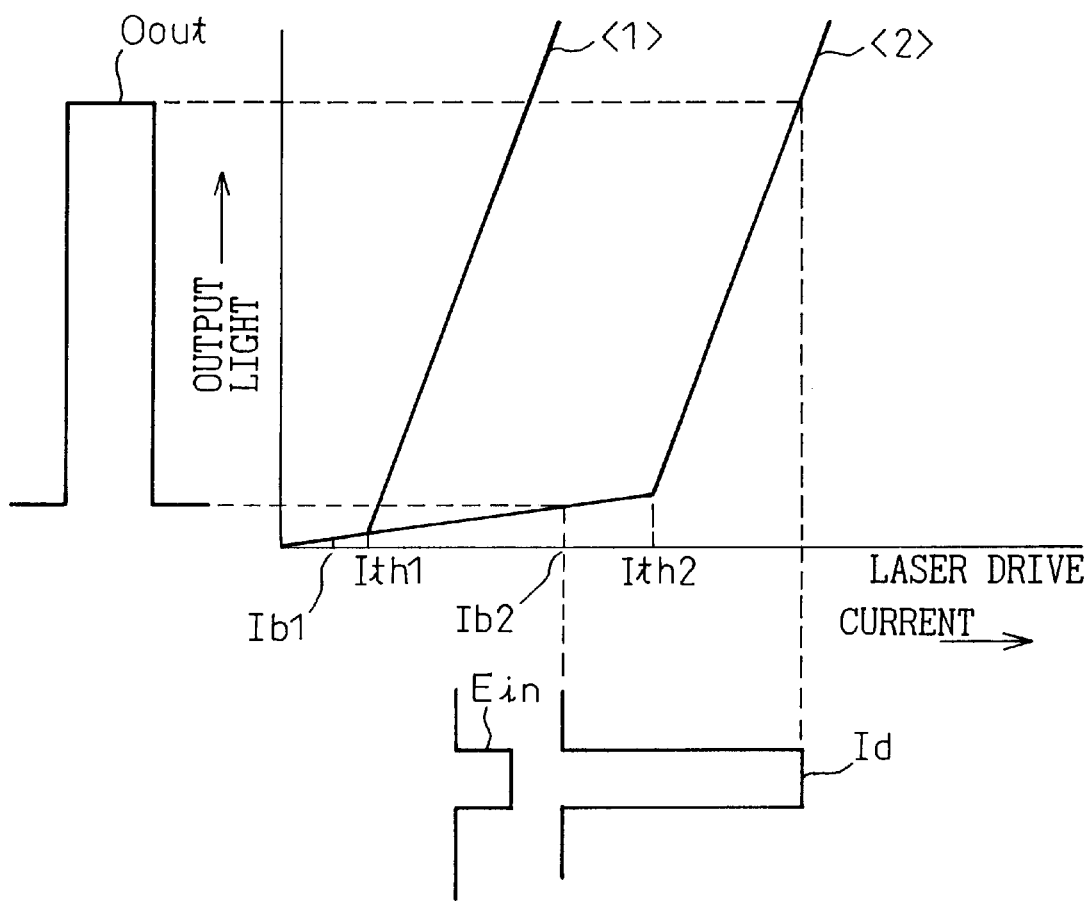
FIG. 11 is a graph of the relationship of the laser diode current and output light when operated under the bias current drive method.

FIG. 11 is a graph of the relationship of the laser drive current and output light, when operated under the bias current drive method. Namely, it is a graph of the laser diode in the laser diode drive circuit of the second example (comprising all constituent elements 1, 2, and 3 of FIG. 10) mentioned above.

In the figure, the abscissa represents the laser drive current Id given to the laser diode 1, and the ordinate represents an output light (Oout) from the laser diode 1 emitting light by the laser drive current Id.

In the laser diode drive circuit of the second example based on the bias current drive method, the bias current Ib2 from the bias current source 3 is continuously fed to the laser diode 1. When the signal input Ein is supplied, the laser diode 1 generates the output light Oout as illustrated when the bias drive current Id superimposed on the bias current Ib2 exceeds the threshold current Ith2 specific to the laser diode 1.

However, as already mentioned, the threshold current (Ith) in the conventional laser diode is relatively large. Namely, the laser diode induces laser oscillation in the laser current region where the current exceeds a large threshold value.

When handling increasingly higher speed signal inputs in the future, however, if the threshold current is large, the light emission delay causes a serious problem. For this reason, attempts have been made to further reduce the threshold current and, in fact, laser diodes remarkably reduced in threshold current have been commercialized. Such a laser diode exhibits the characteristic curve <1> plotted nearer the zero point in the figure than the characteristic curve <2>. The threshold current in the case of this characteristic curve <1> is Ith1, where Ith1<Ith2. Thus, with such a characteristic curve <1>, the bias current to be fed by the bias current source 3 also becomes small such as Ib1 in the figure, and Ib1 becomes smaller than Ib2.

However, when the bias current becomes small as with the above Ib1, considering the unavoidable variations and fluctuations in the bias current source 3 per se, it becomes very difficult to hold a very small predetermined bias current Ib1 with a high precision. In addition, the characteristics of the laser diode per se vary due to temperature fluctuations or aging, so there arises the above problem that deterioration of the extinction ratio is almost unavoidable.

Accordingly, the present invention provides a circuit capable of driving a laser diode, even if the bias current varies slightly along with a reduction of the above threshold current, which circuit can maintain such very small bias current precisely and stably at a predetermined value for optimizing the operation of the laser diode.

Figure 1:
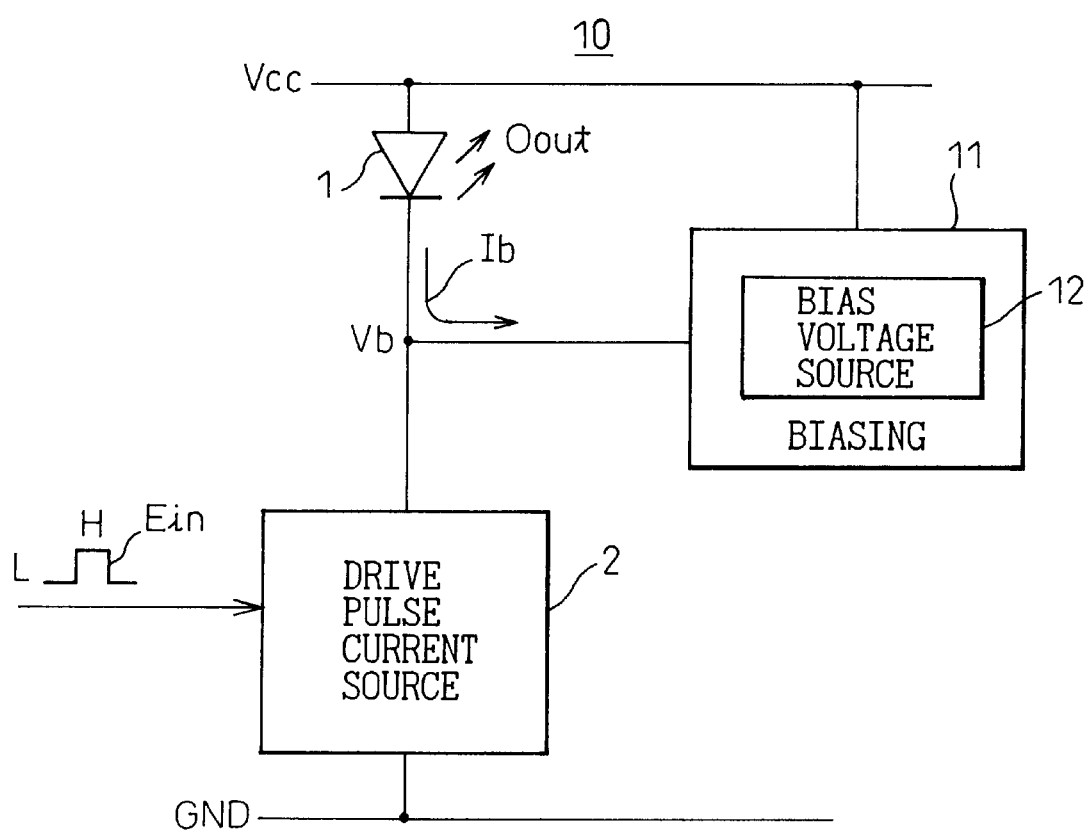
FIG. 1 is a view of the basic configuration of a laser diode drive circuit according to the present invention.

FIG. 1 is a view of the basic configuration of the laser diode drive circuit according to the present invention. In the figure, the component characterizing the present invention is a biasing means 11 having a bias voltage source 12. Namely, the laser diode drive circuit 10 characterizing the basic configuration of the present invention is provided with (1) a laser diode 1; (2) a drive pulse current source 2 emitting light or not emitting light of the laser diode 1 according to the "H" or "L" level of the signal input (Ein); and (3) a biasing means 11 for optimizing the operation of the laser diode 1, the biasing means 11 having a bias voltage source 12 for applying a bias voltage Vb to the laser diode 1, which voltage Vb can feed the optimum bias current Ib to the laser diode 1.

Figure 2:
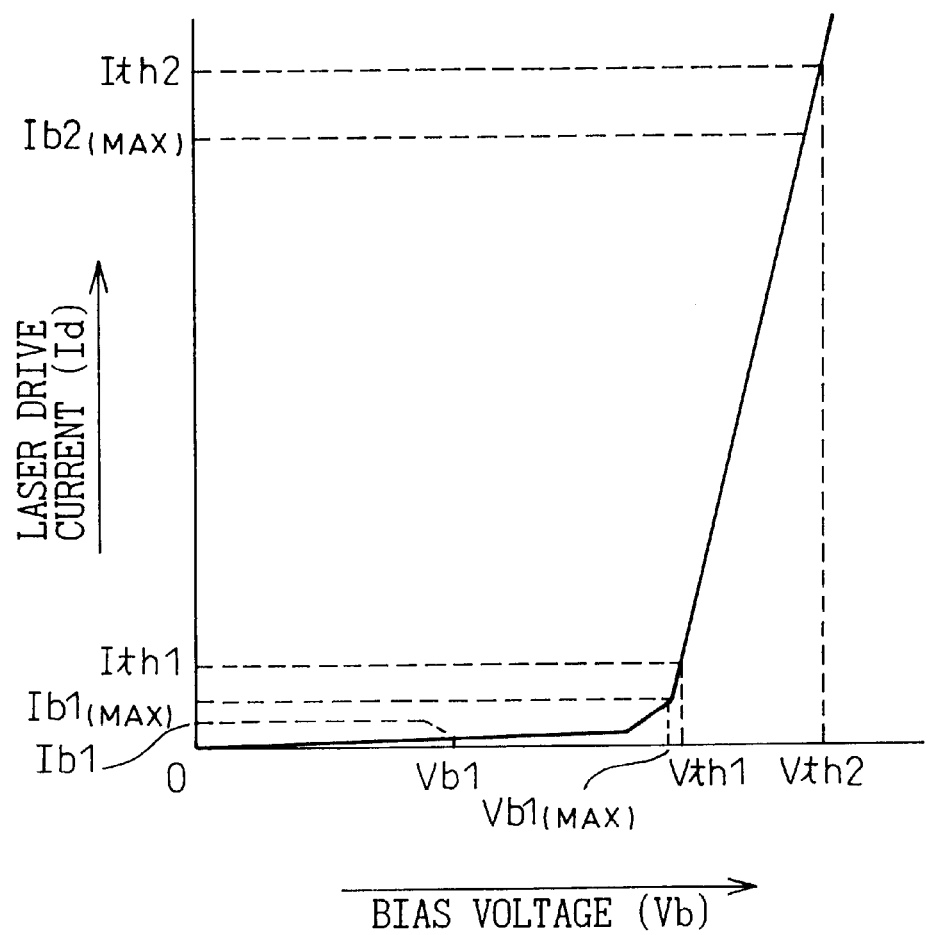
FIG. 2 is a graph for explaining the principle of operation of the present invention.

FIG. 2 is a graph for explaining the principle of operation of the present invention. In the figure, the abscissa represents the bias voltage Vb, and the ordinate represents the laser drive current Id. First, the significance of the numerical values Ith1, Ith2, Ib1, and Ib2 shown in FIG. 11 will be clarified. The threshold current Ith2 in the laser diode drive circuit of the second example (constituent elements 1, 2, and 3 of FIG. 10) is large as shown in FIG. 2. This is because the threshold voltage Vth2 of the laser diode 1 is large as mentioned above. Accordingly, the bias current Ib2 in this case is also set large. The maximum value thereof is Ib2$_{(MAX)}$ in the figure.

However, as mentioned above, the threshold value of the laser diode 1 is being increasingly reduced and becomes Vth1 (Vth1<Vth2) in FIG. 2. Accordingly, the bias current corresponding to such a low Vth1 becomes very small like Ith1 in the figure. In this case, the possible maximum value of the bias current Ib becomes very small like Ib1$_{(MAX)}$ in the figure. For this reason, the usually set bias current becomes the level as indicated by Ib1 in the figure.

It is almost impossible to hold such a very small bias current Ib with a high precision and at a high stability while coping with all fluctuation factors such as manufacturing variations and fluctuations of the bias current source 3 and temperature fluctuations and aging of the laser diode 1 per se.

Therefore, according to the present invention, the common thinking with respect to bias control so far is greatly changed. Namely, in the past, the laser diode 1 has been optimally operated under bias current control, but in the present invention, the optimum operation thereof is realized not by such current control, but by bias voltage control.

Referring to FIG. 2 again, in order to set the very small bias current Ib1 to a predetermined value, the bias voltage Vb1 is controlled according to the present invention. As clear from FIG. 2, since the inclination of the characteristic curve is extremely small, a sufficiently large variation of the bias voltage Vb, in comparison with the variation of the very small bias current Ib1, can be secured. Conversely, even if the bias voltage Vb is slightly deviated from the predetermined value Vb1, if the bias voltage is roughly kept at Vb1, the very small bias current Ib1 can be maintained at the predetermined value with a high precision and at a high stability. In the final analysis, even with relatively rough control of the bias voltage Vb, the bias current Ib can be kept at the very small predetermined value with a high precision and at a high stability. The point of the present invention resides here.

Figure 3:
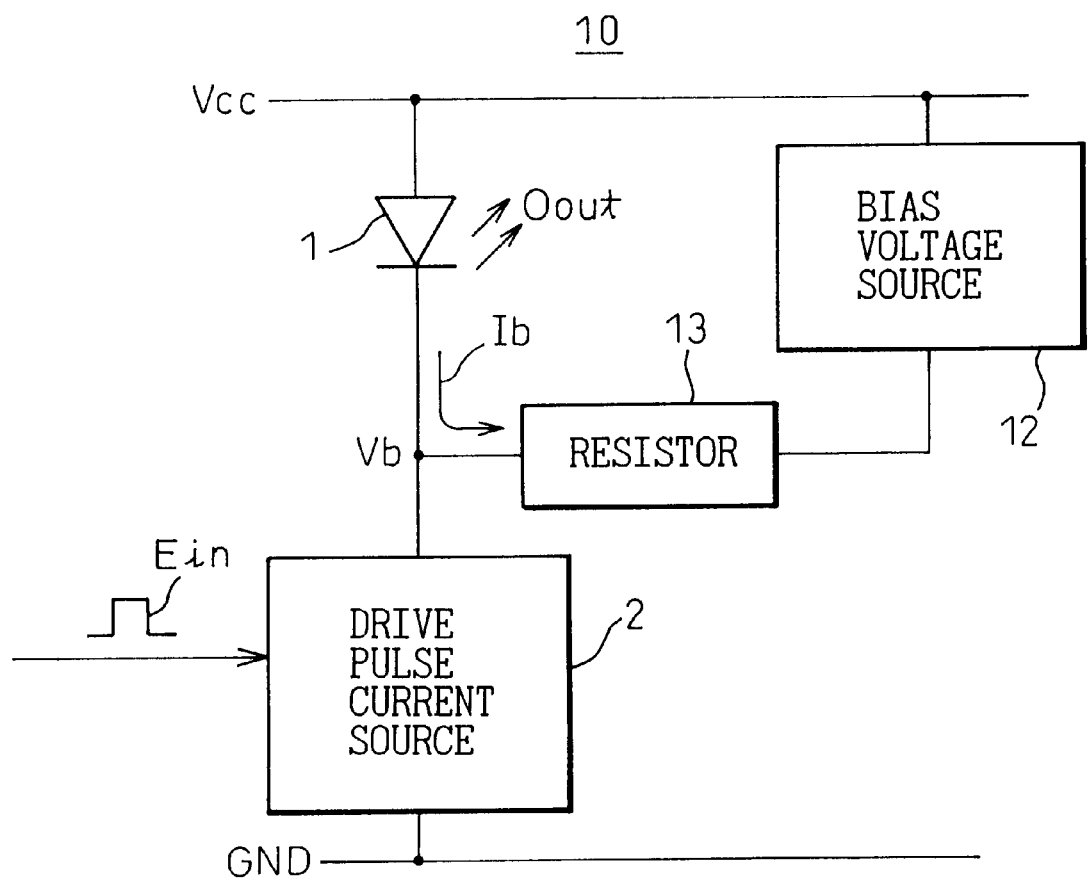
FIG. 3 is a view of a first embodiment according to the present invention.

FIG. 3 is a view of a first embodiment according to the present invention. Note that, similar constituent elements are indicated by the same reference numerals or symbols throughout all figures.

The first embodiment shown in FIG. 3 comprises a laser diode 1, drive pulse current source 2, bias voltage source 12, and a resistor 13. The bias voltage Vb from the bias voltage source 12 is set sufficiently smaller than the minimum threshold voltage at the lowest temperature in the operation of the laser diode in advance so that the laser diode 1 does not oscillate (Vb1$_{(MAX)}$ or less of FIG. 2). This is because, if the bias voltage is set to match the highest temperature, that is, the maximum threshold voltage, when the ambient temperature shifts to the low temperature side thereafter, the laser diode may unintentionally continue to emit light as it is. The operation is as follows.

When the level of the signal input (Ein) to the laser diode drive circuit 10 is "H", the laser drive current is controlled by the drive pulse current source 2. On the other hand, when the level of the signal input (Ein) to the laser diode drive circuit 10 is "L", the laser drive current, i.e., the bias current Ib is determined according to the output voltage of the bias voltage source 12 for applying the bias voltage Vb to the laser diode 1. Note that, if there is no resistor (13), when the level of the signal input (Ein) is "H", the drive pulse current source 2 draws a very large current from the bias voltage source 12 side, and therefore the voltage applied to the laser diode 1 is Vb as is and the laser diode drive current becomes Ib as is. The resistor 13 is inserted so as to suppress this phenomenon.

The bias voltage $V_b$ from the bias voltage source 12 is sufficiently smaller than the minimum threshold voltage of the laser diode 1, therefore the laser diode 1 does not oscillate when the level of the signal input (Ein) to the laser diode drive circuit 10 is "L". Further, the bias current Ib of the laser diode 1 determined by the bias voltage Vb is stable, so the problem of degradation of the transmission characteristics due to the deterioration of the extinction ratio does not occur. The reason why the bias current Ib is stable is that the change of the bias current Ib is very small even if the bias voltage Vb slightly fluctuates as explained referring to FIG. 2.

In this case, by controlling the bias voltage source 12 in accordance with temperature fluctuations by using a thermistor or the like, a further stabler bias current Ib can be held.

Thus, according to the present invention, by controlling the bias current by the bias voltage, a stable and good high speed transmission characteristic can be obtained without a large scale circuit for a ultra-high precision bias current control.

Figure 4:
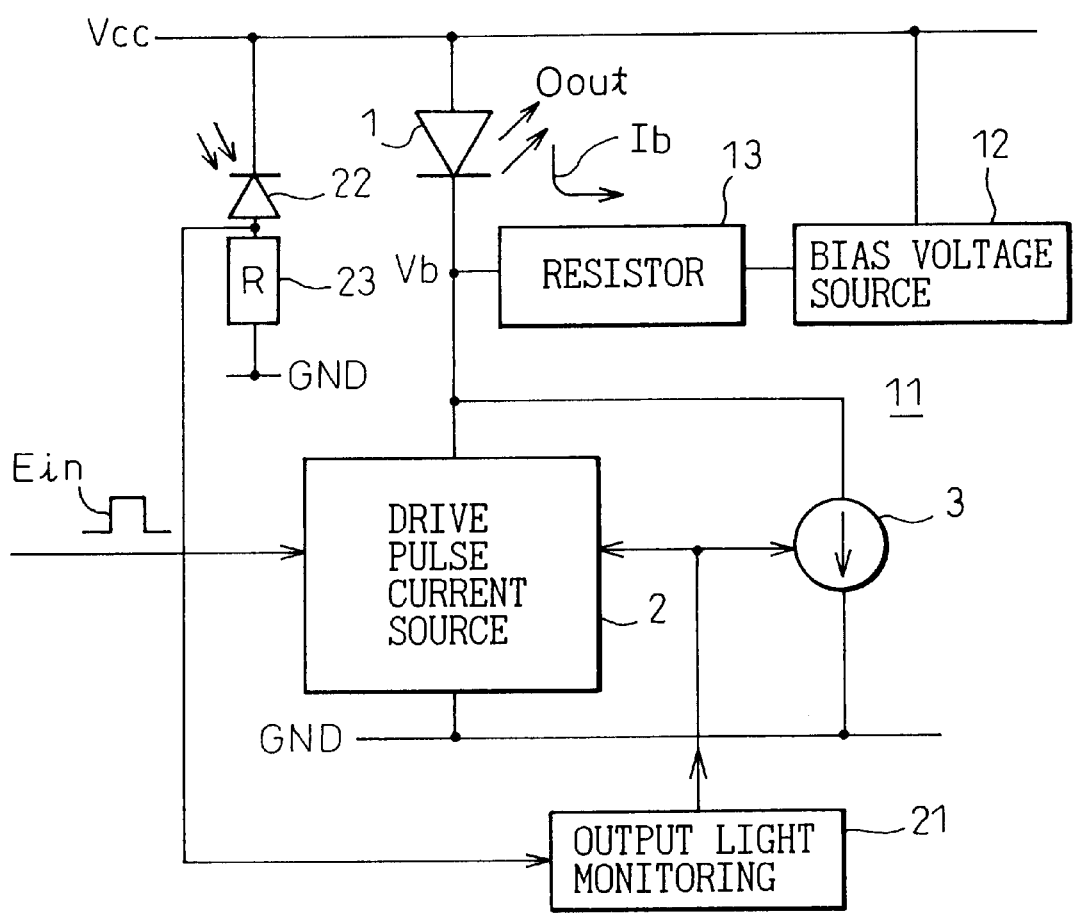
FIG. 4 is a view of a second embodiment according to the present invention.

Next, the embodiment explained by using FIG. 4 is characterized in that the biasing means 11 further has a bias current source 3 for feeding the bias current Ib to the laser diode 1. Note, as shown in FIG. 10, this bias current source per se already exists.

FIG. 4 is a view of a second embodiment according to the present invention. In the figure, the biasing means 11 is constituted by the bias voltage source 12 and the already existing bias current source 3. Both of these bias current source 3 and drive pulse current source 2 are controlled by an already existing output light monitoring means 21 and perform so-called "automatic power control" (APC). Namely, the output light monitoring means 21 monitors the output light from the laser diode 1 via a photodiode 22 and a resistor (R) 23, feeds back the monitoring output to the drive pulse current source 2 and the bias current source 3, respectively, and stabilizes the output light Oout.

This second embodiment also has an advantage that variation of the pulse width of the output light Oout can be suppressed in addition to the advantage of the first embodiment, that is, that a very small bias current Ib can be maintained with a high precision and at a high stability.

Figure 5:
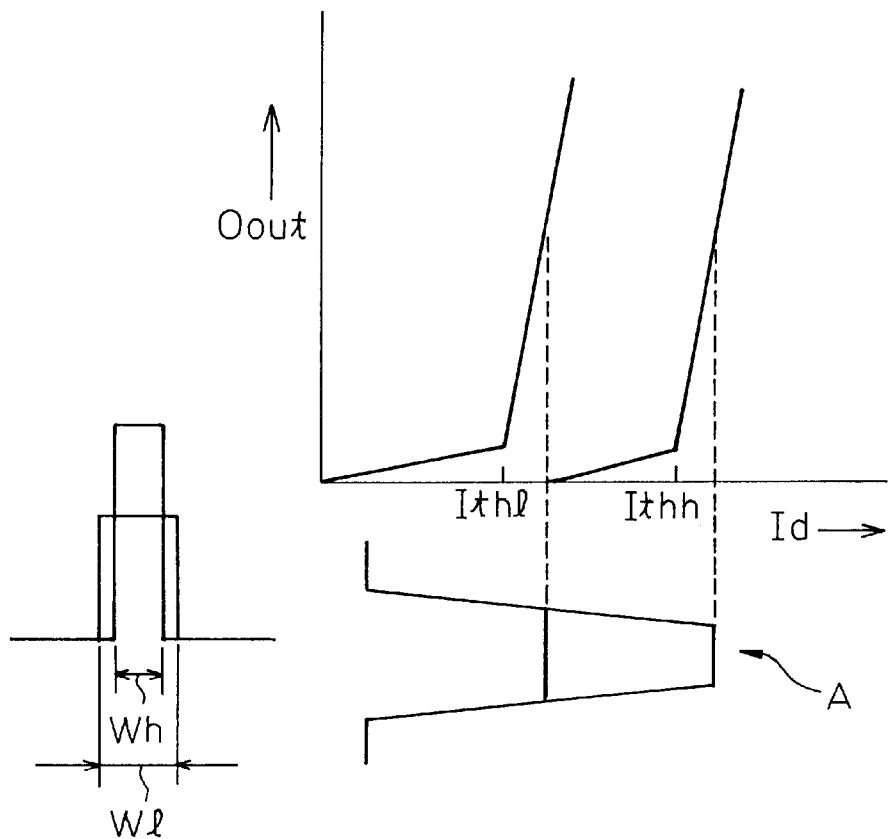
FIG. 5 is a graph for explaining a pulse width variation of output light.

FIG. 5 is a graph for explaining the variation of the pulse width of the output light. In the figure, the abscissa represents the laser drive current Id, and the ordinate represents the output light Oout. In general, the Oout-Id characteristic of the laser diode varies according to the temperature. Namely, the threshold current (Ith) of the laser diode is large like Ith1 at high temperature and small like Ithl at a low temperature.

On the other hand, the laser drive current Id is given to the laser diode 1 as a pulse-shaped current, but is not actually a complete rectangular shape although it is called pulse-shaped and exhibits a trapezoidal shape as shown by a waveform A of FIG. 5. For this reason, the pulse width of the output light Oout becomes wide like Wl at a low temperature and becomes narrow like Wh at a high temperature. Thus, the variation of the pulse width of the output light Oout mentioned above is caused.

Figure 6:
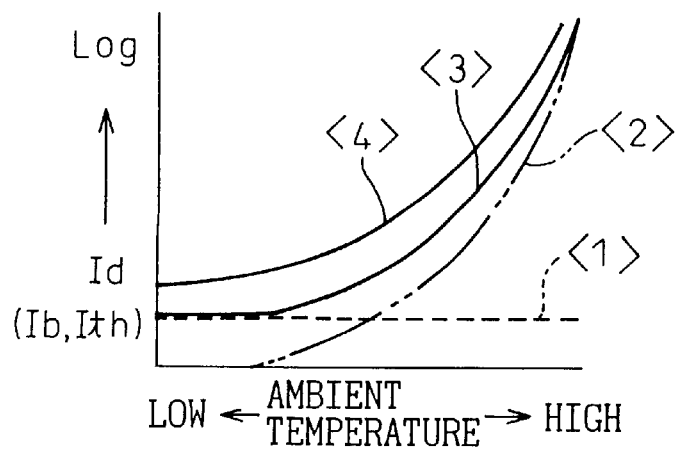
FIG. 6 is a graph of the relationship of the temperature and laser drive current of the laser diode.

FIG. 6 is a graph of the relationship of the temperature and laser drive current of the laser diode. As shown in FIG. 5, the laser drive current (Id) has a temperature characteristic. The threshold current (Ith) of the laser drive current is increased (Ith1) at a high temperature, and the threshold current is lowered at a low temperature (Ithl). By this reason, the variation of the pulse width as represented in FIG. 5 is caused. Such a pulse width variation becomes more conspicuous as the speed of operation of the laser diode drive circuit 10 becomes higher.

Among the characteristic curves <1> to <4> shown in FIG. 6, the characteristic curve <4> shows the change of the threshold current (Ith) along with the above temperature fluctuation. Accordingly, if the bias current (Ib) can also be changed to follow the change of the threshold current (Ith) represented by this characteristic curve <4>, the variation of the pulse width caused along with the temperature fluctuation mentioned above can be considerably reduced. Namely, an output light Oout always having a constant pulse width can be obtained in spite of the temperature fluctuation.

Therefore, at a high temperature, the bias current (Ib) is increased to match the increase of the threshold current (Ith). On the other hand, at a low temperature, also the bias current (Ib) is decreased to match the decrease of the threshold current (Ith). In this case, the bias current produced only by the conventional bias current source 3 can be changed along the above characteristic curve <4> in response to the feedback control by the output light monitoring means 21 of FIG. 4. However, this is bias current control per se, therefore, as already explained referring to FIG. 11 and FIG. 2, at a very small threshold current (Ith), a very small bias current (Ib) cannot be controlled with a high precision in keeping with this very small Ith. Therefore, as represented by the characteristic curve <2> of FIG. 6, in the range of the very small threshold current (Ith) along the characteristic curve <4>, the bias current controlled by the bias current source 3 is made substantially zero.

On the other hand, under the control by the bias voltage source 12, the feature of the present invention, the very small bias current can be maintained with an extremely high precision and at an extremely high stability. The characteristic curve <1> of FIG. 6 shows this characteristic.

Here, referring to the second embodiment of FIG. 4 again, in this laser diode drive circuit 10, the bias current source 3 in the biasing means 11 (together with the output light monitoring means 21) realizes the characteristic curve <2> of FIG. 6, and the bias voltage source 12 in the biasing means 11 can realize the characteristic curve <1> of FIG. 6. The controls of these bias current source 3 and bias voltage source 12 are combined to control the laser diode 1, whereby a characteristic curve combining the characteristic curve <2> and the characteristic curve <1> can be obtained. This combined characteristic curve (<1>+<2>) is represented as the characteristic curve <3> of FIG. 6.

The point here is to obtain a bias current (Ib) having a characteristic curve following the threshold current (Ith) represented by the characteristic curve <4> of FIG. 6. It is seen that the combined characteristic curve <3> is very closely approximated to the desired characteristic curve <4>, and an ideal bias current (Ib) is obtained.

Here, looking at the first and second embodiments (FIG. 3 and FIG. 4) again, the bias voltage source 12 is necessary so that the very small bias current (Ib1 of FIG. 2) is always maintained at the predetermined constant value. However, complete stabilization of the bias current Ib1 cannot be achieved due to the variations in the characteristics of the laser diode 1. This is caused by for example temperature fluctuations or aging of the laser diode 1. A third embodiment of the present invention mentioned below is further provided with a function capable of suppressing the change due to the temperature fluctuations etc. of the bias current (Ib).

Figure 7:
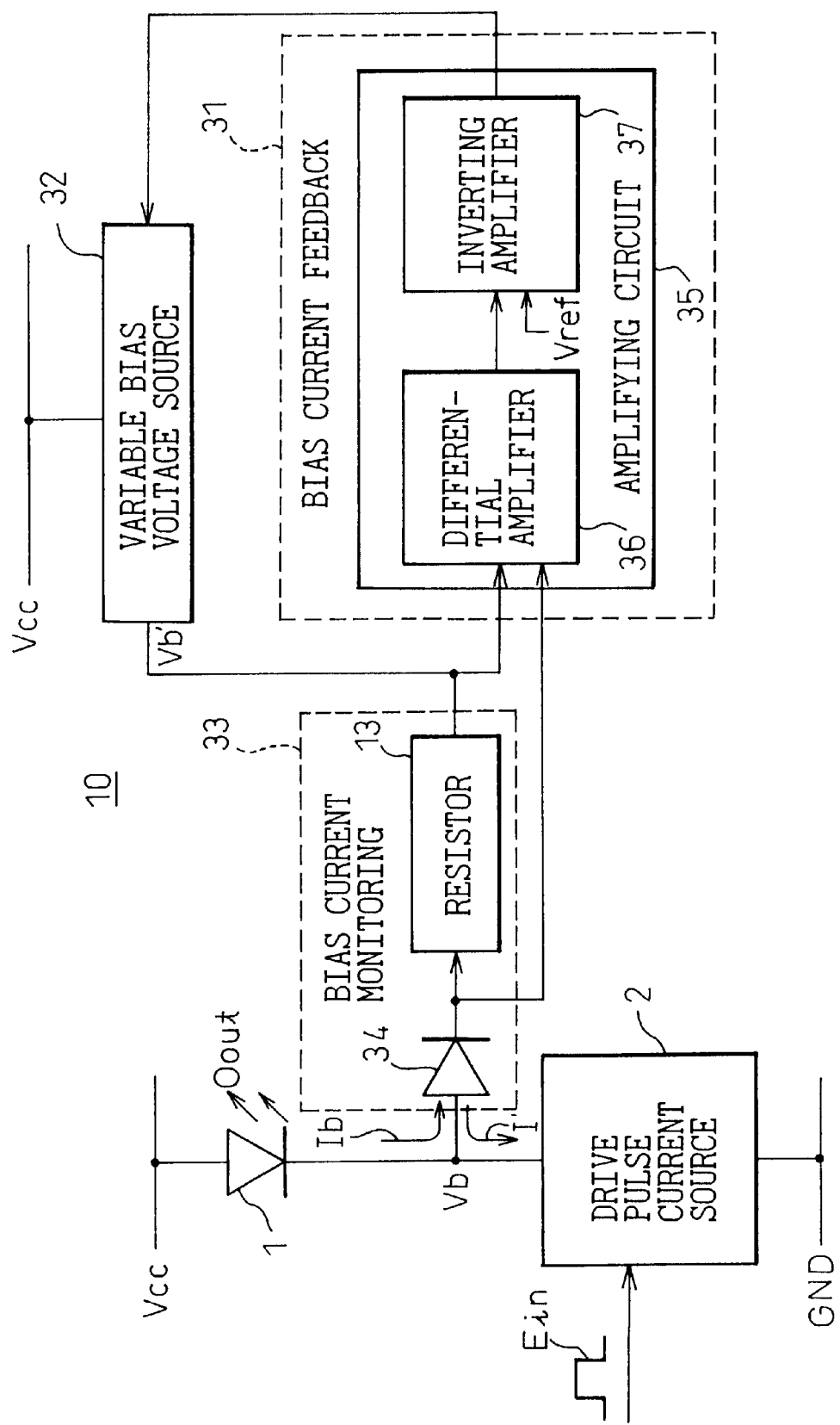
FIG. 7 is a view of a third embodiment according to the present invention.

FIG. 7 is a view of the third embodiment according to the present invention. The laser diode drive circuit 10 according to the third embodiment further has a bias current monitoring means 33 for monitoring the bias current (Ib) fed from a variable bias voltage source 32 to the laser diode 1 in accordance with the bias voltage Vb and a bias current feedback means 31 for changing the bias voltage Vb from the variable bias voltage source 32 in accordance with the monitoring output by this bias current monitoring means 33, as illustrated.

The above resistor 13 is commonly used also as the bias current monitoring means 33. The bias current monitoring means 33 supplies the monitoring output obtained by detecting the voltage drop at the resistor 13 to the bias current feedback means 31.

This bias current feedback means 31 comprises an amplifying circuit 35 which produces a differential voltage between the above voltage drop and a predetermined reference voltage Vref so as to feed back the differential voltage to the variable bias voltage source 32.

Further, a diode 34 for blocking the current I', when the drive pulse current source 2 is ON, from flowing into the bias current monitoring means 33 is mounted on the input side of the bias current monitoring means 33. This is because, when such a current I' flows, the bias current monitoring means 33 generates an erroneous monitoring output.

In this way, in the third embodiment, the bias current Ib is continuously monitored by the resistor 13, and the bias voltage Vb from the bias voltage source 32 is made variable so that this current Ib becomes a constant value defined by the reference voltage Vref. Note that, the circuit of FIG. 7 is illustrated by using the circuit of FIG. 3 (first embodiment) as a base, but it can be of course applied even if the circuit of FIG. 4 (second embodiment) is used as a base (FIG. 8).

Figure 8:
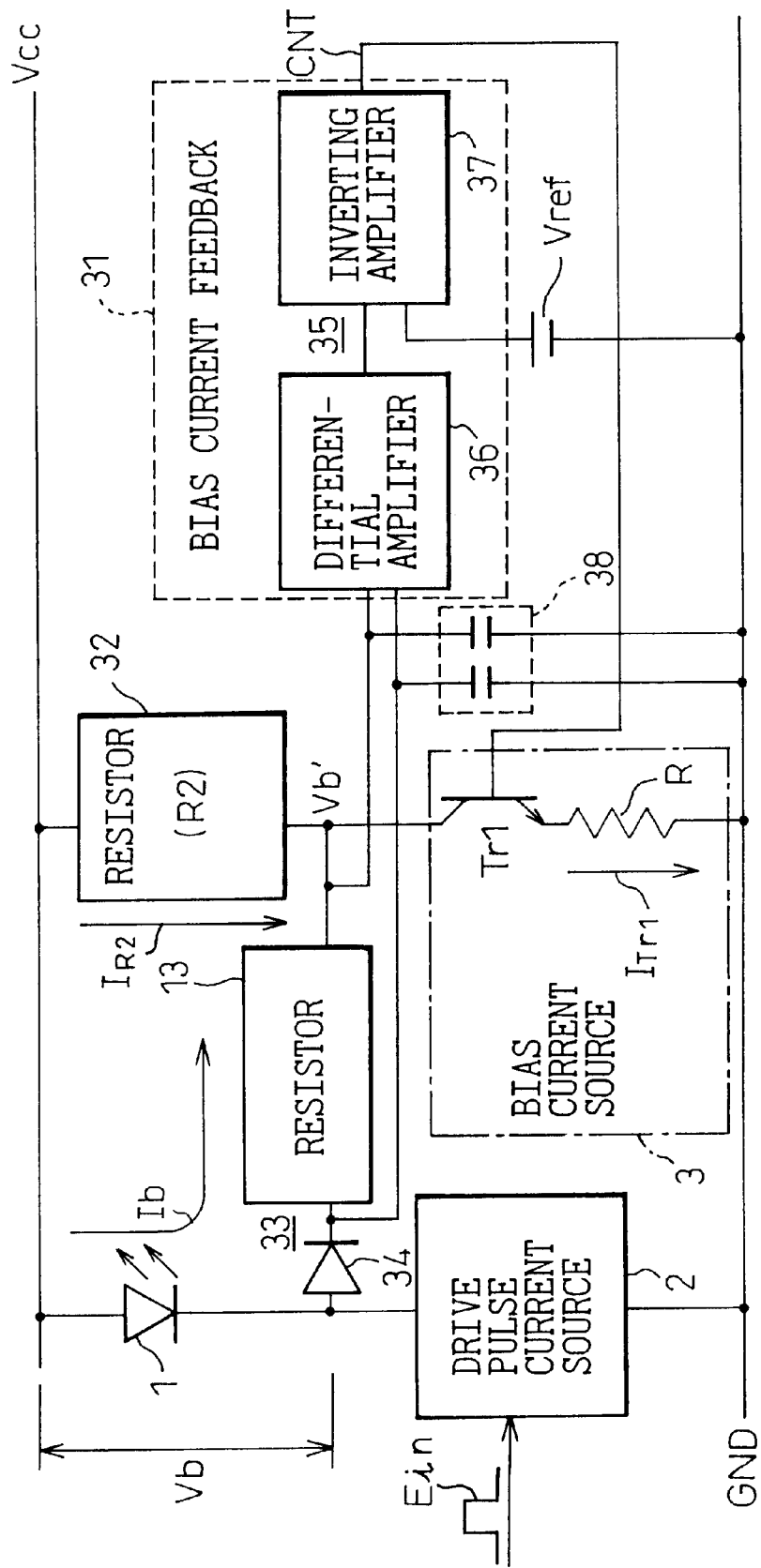
FIG. 8 is a view of a concrete example of the third embodiment adopting the second embodiment as a base.

FIG. 8 is a view of a concrete example of the third embodiment adopting the second embodiment as a basis. As shown in the figure, the variable bias voltage source 32 is extremely simply realized by a resistor (R2) 32. R2 is for example 180 Ω. In this case, the resistor 13 is for example 10 KΩ.

Further, the bias current source 3 is constituted by a transistor Tr1 and a resistor R connected in series therewith and feeds back the output of the bias current feedback means 31 to the bias current source 3, thereby making the output voltage Vb' of the bias voltage source 32 variable.

Further, in the figure, a capacitor means 38 for averaging the value of the aforesaid voltage drop across the resistor 13 is shown. The monitoring voltage by the resistor 13 varies along with the change of the signal input Ein to "H" or "L", therefore it is desired to make this voltage a stable DC monitoring voltage. The capacitor means 38 is provided for this purpose.

Based on the circuit of FIG. 8, it is proved by using concrete numerical values that the bias voltage Vb is kept constant by the laser diode drive circuit of the third embodiment even if there is a variation due to fluctuations (0° C.←→25° C.←→60° C.) of the bias current Ib by temperature. Note that, when the threshold current of the laser diode 1 to be used is 500 µA and the set value of the bias current Ib is 100 µA, it is assumed that, when Ib=100 µA, the bias voltage Vb is 0.5 V when Ta=25° C., 0.7 V when Ta=0° C., and 0.3 V when Ta=60° C., and the voltage drop of the diode is 0.3 V.

Accordingly, under initial conditions (Ta=25° C.), the current $Ib_{(25)}$ driven by the bias current source 3 becomes:

| 100(µA) | [1]($Ib_{(25)}$) |
|---|---|
| [(0.3+0.5)(V)+100(µA)×10(kΩ)]/180(Ω)=10.0(mA) | [2]($I_{R2(25)}$) |
| [1]+[2]=10.1(mA) | [3]($I_{Tr1(25)}$) |

(note that, (25) represents 25° C.).

The circuit operation is as follows. First, the value of Ib is detected by both the resistor 13 (acting as bias current monitor) and a differential amplifier 36. An inverting amplifier 37 at the next stage outputs a control signal CNT to the bias current source 3 so as to always keep the value of the input Ib constant by an imaginary ground. By both the bias current source 3 and resistor (R2), Vb (in the present example, 0.8 V when Ta=25° C.) is determined, and the bias current Ib defined by the bias voltage Vb flows into the laser diode 1.

Next, the circuit operation when, for example, the ambient temperature of the laser diode 1 changes to 60° C. will be explained below. At Vb=1.8 V, assuming that the ambient temperature rises to Ta=60° C., the current Ib starts increasing. The voltage drop across the resistor 13 starts increasing as well along with this. Accordingly, the output voltage of the differential amplifier 36 at the next stage starts rising, while the output (CNT) of the inverting amplifier 37 starts dropping because of the inherent imaginary ground so as to keep the input voltage of the inverting amplifier 37 constant. The input voltage of the bias current source 3 starts dropping, and along with this, the laser drive current Id starts decreasing. By this, the voltage drop across the resistor R2 decreases, that is, the bias voltage Vb becomes small (Vb$_{(60)}$32 0.7 V).

In this way, the increase due to the temperature rise of the bias current Ib is cancelled by the decrease of the bias voltage Vb. As a result, the current Ib does not fluctuate. The condition of the current, in this case, becomes as in the following equation:

$100(\mu A)$     [4]($Ib_{(60)}$)

$[(0.3+0.3)(V)+100(\mu A) \times 10(k\Omega)]/180(\Omega)=8.9(mA)$     [5]($I_{R2(60)}$)

$[4]+[5]=9.0(mA)$     [6]($I_{Tr1(60)}$)

Similarly, when the ambient temperature becomes Ta=0° C., it becomes:

$100(\mu A)$     [7]($Ib_{(0)}$)

$[(0.7+0.3)(V)+100(\mu A) \times 10(k\Omega)]/180(\Omega)=11.1(mA)$     [8]($I_{R2(0)}$)

$[7]+[8]=11.2(mA)$     [9]($I_{Tr1(0)}$)

and the decrease due to the temperature drop of the bias current Ib is cancelled by the increase of the bias voltage Vb. As a result, Ib does not fluctuate.

As understood from the first, second, and third embodiments mentioned in detail above, the technical concept of the present invention can be grasped also as a method for driving the laser diode.

First, there may be provided a method for driving a laser diode for optimally operating the laser diode 1 by feeding the optimum bias current to the laser diode 1, comprising a step for supplying a predetermined bias voltage Vb to the laser diode 1 in order to maintain the above optimum bias current.

Preferably, the predetermined bias voltage Vb is made variable so as to follow any variation of characteristics of the laser diode 1.

More preferably, the laser diode 1 is driven by performing bias voltage control for supplying the predetermined bias voltage Vb to the laser diode 1 and, simultaneously, bias current control for changing the bias current Ib to be fed to the laser diode 1 in accordance with the variation of the monitored output light of the laser diode 1.

Finally, a detailed example of the circuit will be shown by using the basic embodiment (first embodiment) of the present invention as a representative case.

Figure 9:
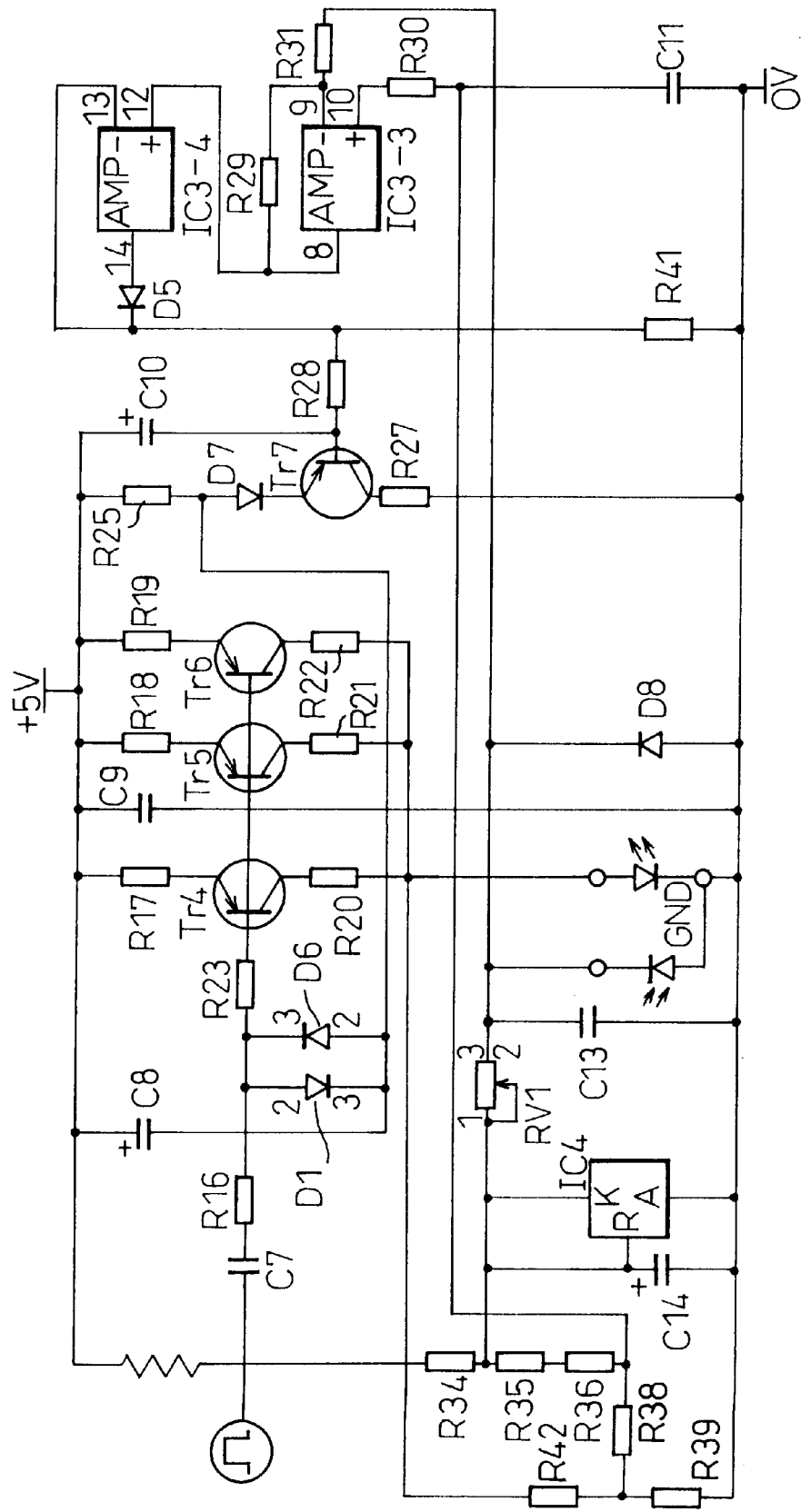
FIG. 9 is a view of an example of a detailed circuit structure of the first embodiment.

FIG. 9 is a view of an example of the detailed circuit structure of the first embodiment. In the figure, the transistors Tr4 to Tr6 and resistors R17 to R19 constitute the drive pulse current source 2. The resistor R42 on the left end in the figure corresponds to the resistor 13. The resistors R35 to R38 constitute the bias voltage source 12. An example using the resistor R39 as the bias current source 3 is shown.

As explained above, according to the present invention, in an electro-optic signal converter using a laser diode having a threshold current varying very slightly due to high speed driving, a bias current which becomes very small along with the threshold current which becomes very small can be kept at a predetermined value with a high precision and at a high stability without using a large scale control circuit. As a result, deterioration of the extinction ratio is greatly reduced, and a high quality, high speed optical transmission characteristic can be maintained.

Further, in the high speed driving laser diode, variation of the pulse width of the output light along with the temperature can be suppressed While the invention has been described with reference to specific embodiments chosen for purposes of illustration, it should be apparent that numerous modifications could be made thereto by those skilled in the art without departing from the basic concept and scope of the invention.

What is claimed is:

1. A circuit for driving a laser diode comprising:
   a laser diode;
   a drive pulse current source emitting light or not emitting light of said laser diode in accordance with an "H" or "L" signal input level; and
   a biasing means for optimizing an operation of said laser diode, the biasing means having a bias voltage source for applying a bias voltage to the laser diode, which bias voltage can feed an optimum bias current to said laser diode.

2. A circuit for driving the laser diode according to claim 1, wherein said biasing means further has a bias current source for feeding said bias current to said laser diode.

3. A circuit for driving the laser diode according to claim 2, wherein it further has an output light monitoring means for monitoring the output light from said laser diode and feeding back the monitoring output to said drive pulse current source and said bias current source respectively to stabilize said output light.

4. A circuit for driving the laser diode according to claim 1, wherein it has:
   a bias current monitoring means for monitoring said bias current fed to said laser diode in accordance with said bias voltage from said bias voltage source; and
   a bias current feedback means for changing the bias voltage from the bias voltage source in accordance with the monitoring output by the bias current monitoring means.

5. A circuit for driving the laser diode according to claim 1, wherein it provides a resistor connected between the output side of said bias voltage source and the output side of said laser diode.

6. A circuit for driving the laser diode according to claim 4, wherein it provides a resistor connected between the output side of said bias voltage source and the output side of said laser diode; and said bias current monitoring means detects the voltage drop across the resistor and uses this as said monitoring output.

7. A circuit for driving the laser diode according to claim 6, wherein said bias current feedback means comprises an amplifying circuit which produces a differential voltage between said voltage drop and a predetermined reference voltage and feeds back the differential voltage to said bias voltage source.

8. A circuit for driving a laser diode, comprising:
   a laser diode;
   a drive pulse current source emitting light or not emitting light of said laser diode in accordance with an "H" or "L" signal input level;
   a biasing means for optimizing an operation of said laser diode, the biasing means having a bias voltage source for applying a bias voltage to the laser diode, which bias voltage can feed an optimum bias current to said laser diode;
   a bias current monitoring means for monitoring said bias current fed to said laser diode in accordance with said bias voltage from said bias voltage source;
   a bias current feedback means for changing the bias voltage from the bias voltage source in accordance with the monitoring output by the bias current monitoring means;
   a resistor connected between the output side of said bias voltage source and the output side of said laser diode; and said bias current monitoring means detects the voltage drop across the resistor and uses this as said monitoring output; and
   a capacitor means for averaging the value of the voltage drop across said resister.

9. A circuit for driving the laser diode according to claim 4, wherein a diode for blocking, when said drive pulse current source is ON, the current from flowing into said bias current monitoring means is mounted at the input side of the bias current monitoring means.

10. A circuit for driving a laser diode, comprising:

a laser diode;

a drive pulse current source emitting light or not emitting light of said laser diode in accordance with an "H" or "L" signal input level;

a biasing means for optimizing an operation of said laser diode, the biasing means having a bias voltage source for applying a bias voltage to the laser diode, which bias voltage can feed an optimum bias current to said laser diode;

a resistor connected between the output side of said bias voltage source and the output side of said laser diode; and a capacitor means for averaging the value of the voltage drop across said resister.

11. A method for driving a laser diode, comprising:

emitting light or not emitting light of said laser diode with a drive pulse current source in accordance with an "H" or "L" signal input level;

optimizing an operation of said laser diode with a bias voltage to the laser diode, by feeding an optimum bias current to said laser diode; and averaging the value of the voltage drop across a resister connected between the output side of said bias voltage source and the output side of said laser diode.

12. A method for driving a laser diode for feeding an optimum bias current to the laser diode to optimally operate the laser diode, wherein a predetermined bias voltage is applied to said laser diode so as to maintain said optimum bias current, and wherein said predetermined bias voltage is made variable to follow any variation of characteristics of said laser diode.

13. A method for driving a laser diode for feeding an optimum bias current to the laser diode to optimally operate the laser diode, wherein a predetermined bias voltage is applied to said laser diode so as to maintain said optimum bias current, and wherein the laser diode is driven by performing a bias voltage control for applying said predetermined bias voltage to said laser diode and, simultaneously, a bias current control for changing the bias current to be fed to the laser diode in accordance with the variation of the monitored output light of said laser diode.

* * * * *